United States Patent [19]
Roth

[11] 3,820,112
[45] June 25, 1974

[54] HIGH SPEED ANALOG-TO-DIGITAL CONVERSION SYSTEM

[76] Inventor: Albert Roth, 248 Rockhurst Dr., San Diego, Calif. 92120

[22] Filed: Oct. 1, 1973

[21] Appl. No.: 402,241

[52] U.S. Cl. .................... 340/347 AD, 340/347 SH
[51] Int. Cl. .......................................... H03k 13/02
[58] Field of Search ................ 340/347 AD, 347 SH

[56] References Cited

UNITED STATES PATENTS

| | | | |
|---|---|---|---|
| 3,059,228 | 10/1962 | Beck et al. | 340/347 SH |
| 3,594,765 | 7/1971 | Lerouge et al. | 340/347 AD |

*Primary Examiner*—Malcolm A. Morrison
*Assistant Examiner*—R. Stephen Dildine, Jr.
*Attorney, Agent, or Firm*—R. S. Sciascia; G. J. Rubens; J. W. McLaren

[57] ABSTRACT

A high speed analog-to-digital conversion system is provided by utilizing a number of standard analog-to-digital converters in a "pipeline" mode of operation, sampling the analog data at high speeds, multiplexing each sample successively into each channel of the analog-to-digital converter array, performing the serial analog-to-digital conversion in each channel, feeding the serial data from each channel into its respective tri-state shift register, and finally reading the contents of each shift register in parallel to a common bus.

5 Claims, 1 Drawing Figure

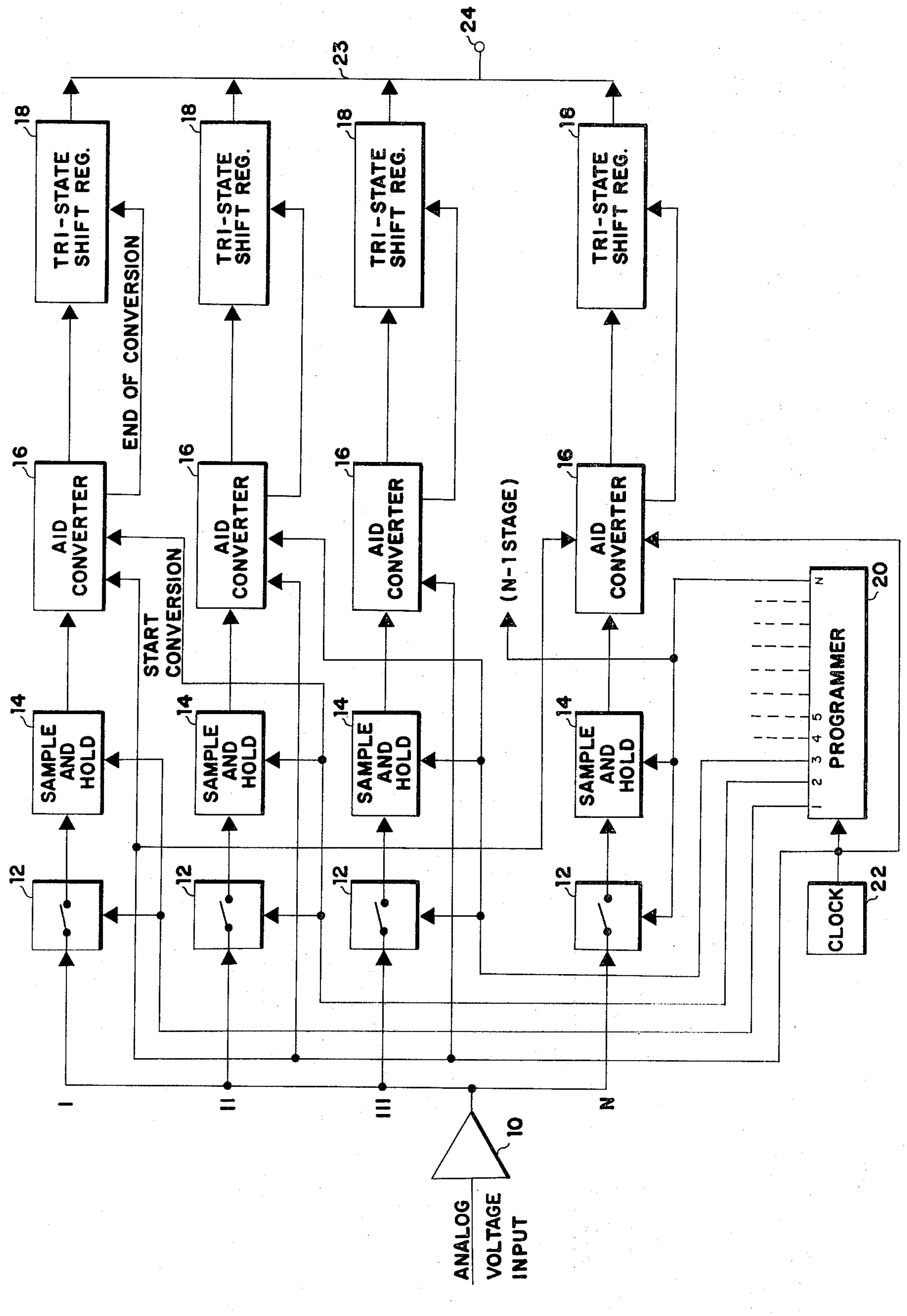
ANALOG
VOLTAGE
INPUT
10
I
II
III
N
12
14
SAMPLE
AND
HOLD
16
A/D
CONVERTER
18
TRI-STATE
SHIFT REG.
END OF CONVERSION
START
CONVERSION
(N-1 STAGE)
23
24
PROGRAMMER
20
1
2
3
4
5
N
CLOCK
22

HIGH SPEED ANALOG-TO-DIGITAL CONVERSION SYSTEM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to high speed analog-to-digital converters wherein the error contributed by the encoder is held to a minimum. In known analog-to-digital converter systems as for example, the system disclosed in U.S. Pat. No. 3,599,204 to John A. Severin, a 22 bit conversion is made with each clock pulse, However, each one bit encoder accepts an analog voltage, V1, multiplies it by a factor K, and generates an output analog voltage V0, which is inputted to the following one-bit encoder. Any error, δ, contributed by the encoder is multiplied by n, so that the output error is $n\ \delta$. Also in the prior known system there must be as many channels as there are bits in the converter. For example, a ten bit converter requires ten channels or 45 flip-flops even though only a 2:1 speed improvement may be required. Also in this type of system the design is fixed by the method of making the conversion.

SUMMARY OF THE INVENTION

The present invention provides an analog-to-digital converter system in which standard analog-to-digital converters may be utilized to provide a converting system wherein the speed is directly proportional to the number of channels and in which any clocked type of the analog-to-digital converter may be used so that an optimum configuration may be obtained for a particular application. The present invention provides analog-to-digital conversion at sampling speeds far in excess of any known converter available in a single converter. It is adaptable to many different types of analog-to-digital converters, so that trade-offs between speed, accuracy, complexity, size, power consumption, and cost can be readily implemented. Also the present invention lends itself to the utilization standard components to obtain high resolution, high speed digital conversion on a single chip without the requirement for precision components. Such a circuit could be built using MOS or bipolar technology to implement such basic analog-to-digital converters as the circulation or charge equalization type, which although considerably slower than the conventional successive approximation converter, is simple and do not require a large number of precision components. The present invention provides an analog-to-digital converter whose output rate, or sampling speed, is not dictated by the conversion speed of the individual analog-to-digital converters. The sampling speed is limited only by the characteristics of the sample and hold circuit. The conversion speed is limited by the number of bits to be generated (resolution) and the characteristics of the type of analog-to-digital used. Therefore relatively slow analog-to-digital converters may be used at very high sampling rates by providing the required number of channels such that the conversion time is equal to the product of the sampling period times the number of channels. The clock pulses for the sampling function and the bit conversion must be scaled accordingly. In addition because all channels of the device are identical, the cost of building a multichannel device is practically the same as that for a single channel converter. If successive approximation analog-to-digital converters are used to implement this concept, a single resistor ladder network may be used for all channels rather than a separate network for each channel. This would simplify the system and greatly reduce the cost and size since a high accuracy resistor network is bulky and expensive.

OBJECTS OF THE INVENTION

Accordingly, an object of the invention is to provide a high speed analog-to-digital converter with a minimum error.

Another object of the invention is the provision of a novel system of implementing an array of low speed analog-to-digital converters to obtain ultra high speed operation.

Other objects and many of the attendant advantages of this invention will be readily appreciated as the same becomes better understood by reference to the following detailed description when considered in connection with the accompanying drawings wherein there is shown, in the single FIGURE in block diagram form, a preferred embodiment of the invention.

DESCRIPTION OF THE PREFERRED EMBODIMENT

Referring now to the drawings wherein there is shown a number of analog-to-digital converter channels in a "pipeline" mode of operation. An analog input source 10 is applied to each converter channel which comprises a sampling switch 12, hold circuit 14, analog-to-digital converter 16 and shift register 18. The number of channels used depends on the converter speed desired which is controlled by the product of the sampling period times the number of channels. Each sampling switch 12, converter 16, and shift register 18 is controlled by means of a programmer 20 which may be of the ring counter type supplied by clock pulses from clock 22.

In operation and starting with time zero, the first clock pulse from programmer 20 closes analog switch 12 of channel I and transfers the sampled voltage to hold circuit 14 for the complete A/D conversion cycle of each channel. The next clock pulse from programmer 20 closes analog switch 12 of channel II and initiates the most significant bit conversion in channel I. The third clock pulse closes switch 12 of channel III and simultaneously initiates the conversion of the second most significant bit of channel I and the most significant bit in channel II. At the same time the most significant bit of channel I is shifted into its respective shift register 18. This process continues until all n bits of channel I have been generated and shifted into its shift register 18 which is now full. The following clock pulse reads out the contents of shift register 18. This same clock pulse also closes analog switch 12 of channel I and starts the cycle over again. This process continues cyclically, thereby providing an n bit conversion for every clock pulse. It is to be understood that one of the important features of the invention is that the system is not limited to the requirement of handling the same number of channels or bits. For example, five channels of a 10 bit converter could be implemented to provide a five fold improvement in speed over that of a single channel. The clock and programmer would be scaled accordingly.

Obviously many modifications and variations of the present invention are possible in the light of the above teachings. It is therefore to be understood that within the scope of the appended claims the invention may be practiced otherwise than as specifically described.

What is claimed is:

1. A high speed analog-to-digital conversion system comprising:

a. an input source of analog voltage, b. a plurality of parallel connected conversion channels coupled to said input source, c. clock control circuit means coupled to each of said conversion channels for controlling the sampling and conversion of said analog voltage in a predetermined sequence so that the time of conversion is the product of the sampling period times the number of channels.

2. The conversion system of claim 1 wherein each of said conversion channels includes an analog-to-digital converter connected in a pipeline mode of operation.

3. The conversion system of claim 1 wherein each of said conversion channels includes:

a. switch sampling means coupled to said analog voltage source for sampling said analog voltage in response to a control signal from said clock control circuit means, b. sample and hold circuit means coupled to said switch sampling means for holding the sampled voltage for a predetermined time, c. converter circuit means coupled to said hold circuit means for converting said sampled voltage to a digital equivalent, d. shift register means coupled to said converter circuit means for storing the output of said converter circuit, e. output terminal means coupled to said shift register means for receiving the output of said register in response to a reading signal from said converter circuit means.

4. The system of claim 3 wherein said sample and hold circuit means holds the sampled voltage until all channels in sequence have sampled the analog voltage.

5. The system of claim 3 wherein the number of bits in each converter channel may be different from the total number of channels required for a desired speed of conversion.

* * * * *

UNITED STATES PATENT OFFICE
CERTIFICATE OF CORRECTION

Patent No. 3,820,112 Dated June 25, 1974

Inventor(s) Albert Roth

It is certified that error appears in the above-identified patent and that said Letters Patent are hereby corrected as shown below:

Item [76] Inventor's address "248 Rockhurst Dr." should read -- 6248 Rockhurst Dr. --.

Signed and sealed this 8th day of October 1974.

(SEAL)
Attest:

McCOY M. GIBSON JR.
Attesting Officer

C. MARSHALL DANN
Commissioner of Patents